United States Patent [19]

Hokuyou

[11] Patent Number: 4,774,194
[45] Date of Patent: Sep. 27, 1988

[54] PROCESS FOR MANUFACTURING A SOLAR CELL DEVICE

[75] Inventor: Shigeru Hokuyou, Itami, Japan

[73] Assignee: Mitsubishi Denki Kabushiki Kaisha, Tokyo, Japan

[21] Appl. No.: 948,086

[22] Filed: Dec. 31, 1987

[30] Foreign Application Priority Data

Jan. 23, 1986 [JP] Japan .................................. 61-12874

[51] Int. Cl.$^4$ ............................................. H01L 31/18
[52] U.S. Cl. ......................................... 437/5; 437/228; 437/974; 148/DIG. 135; 136/262
[58] Field of Search .................. 437/2, 5, 225, 226, 437/228, 974; 136/262; 148/DIG. 135

[56] References Cited

U.S. PATENT DOCUMENTS 4,692,559  9/1987  Ellion et al. ......................... 136/262
4,727,047  2/1988  Bozler et al. ........................ 437/89

FOREIGN PATENT DOCUMENTS 52-75172  6/1977  Japan .................................... 136/262

OTHER PUBLICATIONS

*NASA Tech Briefs*, Summer 1980, p. 135.
S. Matsuda et al, *Conference Record, 17th IEEE Photovoltaic Specialists Conf.* (1984), pp. 97–102.
Fan et al., "GaAs Cleft Solar Cells for Space Applications", 17th *IEEE Photovoltaic Specialists Conference*, pp. 31–35 (1984).
Nagai et al., "High Efficiency GaAs Thin Film Solar Cells by Peeled Film Technology", *J. of Crystal Growth*, 45:277–280 (1978).

*Primary Examiner*—Aaron Weisstuch
*Attorney, Agent, or Firm*—Saidman, Sterne, Kessler & Goldstein

[57] ABSTRACT

A process for manufacturing a solar cell device, including the steps of (1) forming, on a semiconductor substrate, a removable layer having a crystal lattice structure identical or similar to that of the substrate; (2) forming, on the removable layer, a solar cell structure having a crystal lattice structure identical or similar to that of the removable layer; (3) forming, on the solar cell structure, a reinforcement layer having a sufficient mechanical strength to support solar cell structure, the removal layer being formed of a material whose rate of etching is higher than that of the solar cell structure and the reinforcement layer; (4) and removing the removable layer by etching, to separate the solar cell structure supported by the reinforcement layer from the substrate, so that the surface of the solar cell structure for receiving incident light is exposed.

29 Claims, 1 Drawing Sheet

PROCESS FOR MANUFACTURING A SOLAR CELL DEVICE

BACKGROUND OF THE INVENTION

The present invention relates to a process for manufacturing a solar cell device, particularly one having a solar cell structure formed of a semiconductor material such as a compound semiconductor material. An example of such a solar cell is an AlGaAs/GaAs solar cell.

AlGaAs/GaAs solar cells have a higher conversion efficiency than any other solar cells which have been developed for practical use. However, the GaAs substrate is expensive, and heavy, having a specific gravity twice that of Si. Moreover, GaAs has a low mechanical strength since it has a tendency to cleave.

To alleviate the above problems, the following proposals have been made.

(a) First Proposal (for reducing weight and cost). $Al_xGa_{1-x}As$ and GaAs have substantially the same crystal lattice structure (lattice dimension), so that there is no mismatch (disorder in the crystal structure) at the interface. It is therefore possible to form a single crystal, or a good quality. Accordingly, by epitaxially growing, p-n junction of GaAs and AlGaAs on a GaAs substrate, a crystal of a good quality is obtained, and a solar cell having a high conversion efficiency can be obtained. /

As x of $Al_xGa_{1-x}As$ approaches 1, the rate of etching by an acid or an alkali becomes higher compared with GaAs.

Utilizing these facts, AlAs or $Al_{x1}Ga_{1-x1}As$, with x1 close to 1, is epitaxially grown on a GaAs substrate, and then a GaAs layer of a first conductivity type, a GaAs layer of a second conductivity type, and an $Al_{x2}Ga_{1-x2}As$ layer of the second conductivity type are formed. Here, x1 is made larger than x2, so that the etching rate of the $Al_{x1}Ga_{1-x1}As$ layer is substantially higher.

After that, the layer of AlAs or $Al_{x1}Ga_{1-x1}As$ is removed by etching to separate the epitaxially grown layers from the substrate to form a thin film AlGaAs/GaAs solar cell. Thus, the GaAs substrate can be re-used. Moreover, the weight of the solar cell can be reduced.

This method has the disadvantage that the thin film of AlGaAs/GaAs has a low mechanical strength, and is often broken during the process of electrode formation and the process of assembly.

(b) Second Proposal (for reducing weight and cost, and for improving the mechanical strength).

In this method, a silicon substrate is used. A layer of a material, such as Ge, having a crystal lattice structure (lattice dimension) equivalent to that of GaAs is formed by metal organic chemical vapor deposition (MOCVD), molecular beam epitaxy (MBE), or the like. Then, a GaAs layer of a first conductivity type, a GaAs layer of a second conductivity type and an AlGaAs layer of the second conductivity type are formed. In this way, the mechanical strength is improved.

A disadvantage of this method is that GaAs single crystal of a good quality cannot be obtained. Accordingly, it is difficult to obtain a stable solar cell having a high conversion efficiency.

SUMMARY OF THE INVENTION

An objective of the invention is to provide a process by which a solar cell can be manufactured to be light in weight and inexpensive, have a high mechanical strength, and a high conversion efficiency.

According to the invention, there is provided a process for manufacturing a solar cell device comprising the steps of:

providing a semiconductor substrate, forming, on the substrate, a removable layer having a crystal lattice structure identical or similar to that of the substrate, forming, on the removable layer, a solar cell structure having a crystal lattice structure identical or similar to that of the removable layer, forming, on the solar cell structure, a reinforcement layer having a sufficient mechanical strength to support the solar cell structure, the removable layer being formed of a material whose rate of etching is higher than that of the solar cell structure and the reinforcement layer, and that of removing the removable layer by etching to separate the solar cell structure supported by the reinforcement layer from the substrate so that the surface of the solar cell structure for receiving incident light is exposed;

wherein the step of forming the solar cell structure comprises forming, on the removable layer, a first solar cell layer having a crystal lattice structure identical or similar to the removable layer, and having a first conductivity type, and forming, on the first solar cell layer, a second solar cell layer having a crystal lattice structure identical or similar to that of the first solar cell layer and having the first conductivity type, the first and the second solar cell layers forming a heterojunction; and forming, on the second solar cell layer, a third solar cell layer having a crystal lattice structure identical to the second solar cell layer and having a second conductivity type;

and wherein the substrate is a single crystal substrate formed of GaAs or AlGaAs, the removable layer is formed of $Al_{x1}Ga_{1-x1}As$, where $x1 \geq 0.9$, the first solar cell layer is formed of $Al_{x2}Ga_{1-x2}As$, where $0.4 \leq x2 \leq 0.8$, and the second and the third solar cell layer are formed of GaAs.

According to a further embodiment of this process, the first solar cell layer has a small light absorption, and the second and the third solar cell layers have a large light absorption.

With the above process, the substrate can be re-used repeatedly, so that the cost of the substrate is essentially eliminated. Moreover, the solar cell structure will be of a single-crystal having a good quality, so that the conversion efficiency will be high. Furthermore, the mechanical strength is much improved by the adoption of the reinforcement layer. Adoption of the reinforcement layer has been enabled by the concept of forming the solar cell structure on a removable layer, which is removed after the formation of the solar cell structure, so that a surface of the solar cell structure receiving the incident light is exposed.

DETAILED DESCRIPTION OF THE PREFERRED EMBODIMENTS

Figure 1:
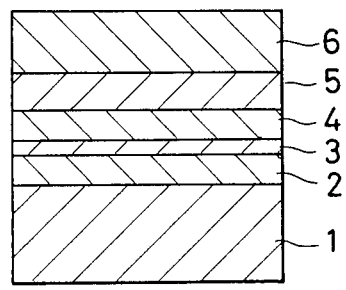
FIG. 1 and FIG. 2 are sectional views showing a solar cell in the process of manufacture at different stages.

The embodiment described with reference to the drawings is a process for manufacturing an AlGaAs/GaAs solar cell.

As illustrated, a GaAs substrate 1 is first provided. Then, a removable layer 2, such as a layer of AlAs or $Al_{x1}Ga_{1-x1}As$ (x1 being set to be close to 1 and greater than x2, later described) is formed to a thickness of 10 to 20 micrometers by liquid phase epitaxy or metal organic chemical vapor deposition (MOCVD). Then, a first solar cell layer 3, such as a layer of p-type $Al_{x2}Ga_{1-x2}As$ (x2=0.5 to 0.7, is epitaxially grown to a thickness of 0.05 to 0.1 micrometers. Then, a second solar cell layer 4, such as a layer of p-type GaAs is epitaxially grown to a thickness of about 0.5 micrometers. Then, a third solar cell layer 5, such as a layer of n-type GaAs, is epitaxially grown to a thickness of 5 to 10 micrometers. The first to the third solar cell layers (3, 4, and 5) in combination form a solar cell structure for directly converting energy of an incident light into electricity. The first and the second solar cell layers form, at their interface, a p—p or n—n type hetero-junction, while the second and the third solar cell layers form, at their interface, a p-n type junction.

After that, a reinforcement layer 6, such as a layer of amorphous silicon of a low resistivity is formed to a thickness of 50 to 100 micrometers by plasma chemical vapor deposition (plasma CVD) or the like.

Figure 2:
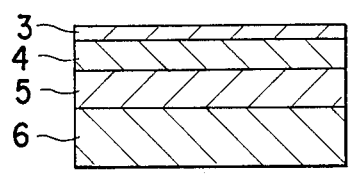

Then the entire wafer is soaked in an aqueous solution of HF, so that the layer 2 is selectively removed by etching. By this etching, the grown layers 3, 4, and 5 supported by the reinforcement layer 6 are separated from the substrate 1 and a surface of the solar cell structure receiving incident light is exposed, as shown in FIG. 2. In FIG. 2, the entire wafer is shown turned over to illustrate one distinction in concept from the prior art.

On the exposed surface of the AlGaAs layer 3, a grid positive electrode and an anti-reflection film are formed. On the surface of the amorphous silicon layer 6, a negative electrode is formed. The wafer is then divided into chips of predetermined dimensions, so that a solar cell is completed.

As will be understood, the layers 2, 3 and 4 have a crystal lattice structure identical or similar to the substrate 1 and the layers 2 and 3 on which they are formed, and the layer 5 has exactly the same crystal lattice structure as the layer 4 on which it is formed. Accordingly, each of the layers 2 through 5 is of a single crystal of a good quality, so that a high conversion efficiency is secured.

The GaAs substrate is separated and can be used repeatedly, so that the cost and the weight can be substantially reduced.

The reinforcement layer 6 is not limited to amorphous silicon, but may be any other material, such as metal such as invar, Kovar, molybdenum or the like, or polycrystalline silicon, as long as it has a high mechanical strength and a thermal expansion coefficient close to GaAs.

Instead of the GaAs substrate, an AlGaAs substrate may be used.

The invention is not limited to AlGaAs/GaAs solar cell, but is applicable to any other semiconductor solar cells, including in particular compound semiconductor solar cells.

What is claimed is:

1. A process for manufacturing a solar cell device, comprising the steps of:
   providing a semiconductor substrate;
   forming, on said substrate, a removable layer having a crystal lattice structure identical or similar to that of said structure;
   forming, on said removable layer, a solar cell structure having a crystal lattice structure identical or similar to that of said removable layer;
   forming, on said solar cell structure, a reinforcement layer having a sufficient mechanical strength to support said solar cell structure, said removal layer being formed of a material whose rate of etching is higher than that of said solar cell structure and that of said reinforcement layer; and
   selectively removing said removable layer by etching, to separate said solar cell structure supported by said reinforcement layer from said substrate, so that a surface of said solar cell structure for receiving incident light is exposed;
wherein said step of forming said solar cell structure comprises
   forming, on said removable layer, a first solar cell layer having a crystal lattice structure identical or similar to that of said removable layer, and having a first conductivity type,
   forming, on said first solar cell layer, a second solar cell layer having a crystal lattice structure identical or similar to that of said first solar cell layer and having said first conductivity type, said first and said second solar cell layers forming a heterojunction therebetween, and
   forming, on said second solar cell layer, a third solar cell layer having a crystal lattice structure identical to said second solar cell layer and having a second conductivity type;
wherein
   said substrate is a single crystal substrate formed of GaAs or AlGaAs,
   said removable layer is formed of $Al_{x1}Ga_{1-x1}As$, where $x1 \geq 0.9$,
   said first solar cell layer is formed of $Al_{x2}Ga_{1-x2}As$, where $0.4 \leq x2 \leq 0.8$, and
   said second and said third solar cell layer are formed of GaAs.

2. A process according to claim 1, wherein
   the first solar cell layer has a relatively small light absorption, and
   the second and the third solar cell layers have a relatively large light absorption.

3. A process according to claim 1, wherein the removable layer is formed to a thickness of about 10 to 20 micrometers,
   the first solar cell layer is formed to a thickness of about 0.05 to 0.1 micrometers,
   the second solar cell layer is formed to a thickness of about 0.5 micrometers, and
   the third solar cell layer is formed to a thickness of about 5 to 10 micrometers.

4. A process according to claim 1, wherein
   the removable layer is formed by liquid phase epitaxy or metal organic chemical vapor deposition (MOCVD).

5. A process according to claim 1, wherein the reinforcement layer is formed of amorphous silicon of a low resistivity.

6. A process according to claim 5, wherein the reinforcement layer is formed to a thickness of about 50 to 100 micrometers.

7. A process according to claim 5, wherein the reinforcement layer is formed by plasma chemical vapor deposition.

8. A process according to claim 1, wherein the step of removing the removable layer comprises etching the removable layer using an etching solution of an acid or an alkali.

9. A process according to claim 1, further comprising the step of forming, on the exposed surface of the solar cell structure, a grid electrode and an antireflection film.

10. A process according to claim 1, further comprising the step of dividing the solar cell structure supported by the reinforcement layer into chips.

11. The process of claim 1, wherein said removable layer is formed to a thickness which is in the range of 10 to 20 microns inclusive.

12. The process of claim 1, wherein said second solar cell layer is p-type.

13. The process of claim 1, wherein said etching steps uses aqueous HF.

14. The process of claim 1, wherein said reinforcement layer is formed to a thickness which is in the range of 50 to 100 microns inclusive.

15. The process of claim 1, wherein said reinforcement layer has low resistivity.

16. The process of claim 1, wherein said reinforcement layer comprises silicon.

17. The process of claim 1, wherein said reinforcement layer is amorphous.

18. A process for manufacturing a solar cell device, comprising the steps of:
 (a) providing a substrate;
 (b) epitaxially forming, on said substrate, a removable layer consisting essentially of $Al_{x1}Ga_{1-x1}As$, where $x1 \geq 0.9$;
 (c) forming, on said removable layer, a first solar cell layer consisting essentially of $Al_{x2}Ga_{1-x2}As$, where $0.4 \leq x2 \leq 0.8$;
 (d) forming, on said first solar cell layer, a second solar cell layer consisting essentially of GaAs;
 (e) forming, on said second solar cell layer, a third solar cell layer consisting essentially of GaAs, said second and third solar cell layers having opposite conductivity types;
 (f) forming, on said third solar cell layer, a reinforcement layer; and
 (g) selectively etching away said removable layer, to separate said first, second, and third solar cell layers, supported by said reinforcement layer, from said substrate, so that said first solar cell layer is exposed for receiving incident light.

19. The process of claim 18, wherein said removable layer is formed to a thickness which is in the range of 10 to 20 microns inclusive.

20. The process of claim 18, wherein said substrate consists essentially of GaAs.

21. The process of claim 18, wherein said second solar cell layer is p-type.

22. The process of claim 18, wherein said selective etching step uses aqueous HF.

23. The process of claim 18, wherein said substrate used in step (a) is used repeatedly for repeating said steps (b) through (g).

24. The process of claim 18, wherein said reinforcement layer is formed to a thickness which is in the range of 50 to 100 microns inclusive.

25. The process of claim 18, wherein said reinforcement layer has low resistivity.

26. The process of claim 18, wherein said reinforcement layer comprises silicon.

27. The process of claim 18, wherein said reinforcement layer is amorphous.

28. The process of claim 18, further comprising the step, subsequent to said step (g), of forming, on the exposed surface of first solar cell layer, a grid electrode and an antireflection film.

29. A process for manufacturing a solar cell device, comprising the steps of:
 (a) providing a substrate;
 (b) epitaxially forming, on said substrate, a removable layer consisting essentially of $Al_{x1}Ga_{1-x1}As$, where x1 has a value between 0.9 and 0.1 inclusive;
 (c) epitaxially forming, on said removable layer, a first solar cell layer consisting essentially of $Al_{x2}Ga_{1-x2}As$, where x2 has a value between 0.4 and 0.8 inclusive;
 (d) epitaxially forming, on said first solar cell layer, a second solar cell layer and a third solar cell layer, said second and third layers having opposite conductivity types;
 (e) depositing a reinforcement layer on said third solar cell layer; and
 (f) selectively etching away said removable layer, to separate said first, second, third, and reinforcement layers from said substrate; and
 (g) repeating said steps (b) through (f).

* * * * *